US009165945B1

United States Patent
Sadaka et al.

(10) Patent No.: US 9,165,945 B1
(45) Date of Patent: Oct. 20, 2015

(54) METHOD FOR FABRICATING SEMICONDUCTOR STRUCTURES INCLUDING TRANSISTOR CHANNELS HAVING DIFFERENT STRAIN STATES, AND RELATED SEMICONDUCTOR STRUCTURES

(71) Applicant: Soitec, Crolles Cedex (FR)

(72) Inventors: Mariam Sadaka, Austin, TX (US);
Bich-Yen Nguyen, Austin, TX (US);
Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/489,798

(22) Filed: Sep. 18, 2014

(51) Int. Cl.
| | | |
|---|---|---|
| *H01L 31/18* | (2006.01) |
| *H01L 27/12* | (2006.01) |
| *H01L 27/092* | (2006.01) |
| *H01L 29/78* | (2006.01) |
| *H01L 21/84* | (2006.01) |
| *H01L 21/8238* | (2006.01) |
| *H01L 21/265* | (2006.01) |
| *H01L 21/324* | (2006.01) |
| *H01L 29/16* | (2006.01) |
| *H01L 29/161* | (2006.01) |

(52) U.S. Cl.
CPC ...... *H01L 27/1211* (2013.01); *H01L 21/26513* (2013.01); *H01L 21/324* (2013.01); *H01L 21/823807* (2013.01); *H01L 21/845* (2013.01); *H01L 27/0922* (2013.01); *H01L 29/16* (2013.01); *H01L 29/161* (2013.01); *H01L 29/7847* (2013.01)

(58) Field of Classification Search
CPC .............. H01L 27/1211; H01L 29/161; H01L 27/0922; H01L 29/7847; H01L 21/823807; H01L 21/26513; H01L 21/845; H01L 29/16; H01L 21/324; H01L 21/8238; H01L 21/8234
See application file for complete search history.

(56) References Cited

U.S. PATENT DOCUMENTS

| | | |
|---|---|---|
| 6,303,468 B1 | 10/2001 | Aspar et al. |
| 6,335,258 B1 | 1/2002 | Aspar et al. |
| 6,756,286 B1 | 6/2004 | Moriceau et al. |
| 6,809,044 B1 | 10/2004 | Aspar et al. |
| 6,946,365 B2 | 9/2005 | Aspar et al. |

(Continued)

OTHER PUBLICATIONS

Wang et al. ("Recrystallization and diffusion in sodium-implanted silicon" Thin Solid Films 295 (1997) 169-177).*

(Continued)

*Primary Examiner* — Marcos D. Pizarro
*Assistant Examiner* — Sue Tang
(74) *Attorney, Agent, or Firm* — TraskBritt

(57) ABSTRACT

Methods of fabricating a semiconductor structure include implanting ion into a second region of a strained semiconductor layer on a multi-layer substrate to amorphize a portion of crystalline semiconductor material in the second region of the strained semiconductor layer without amorphizing a first region of the strained semiconductor layer. The amorphous region is recrystallized, and elements are diffused within the semiconductor layer to enrich a concentration of the diffused elements in a portion of the second region of the strained semiconductor layer and alter a strain state therein relative to a strain state of the first region of the strained semiconductor layer. A first plurality of transistor channel structures are formed that each comprise a portion of the first region of the semiconductor layer, and a second plurality of transistor channel structures are formed that each comprise a portion of the second region of the semiconductor layer.

13 Claims, 7 Drawing Sheets

(56) References Cited

U.S. PATENT DOCUMENTS

| | | | |
|---|---|---|---|
| RE39,484 E | | 2/2007 | Bruel |
| 7,282,402 B2 | | 10/2007 | Sadaka et al. |
| 7,524,740 B1 | | 4/2009 | Liu et al. |
| 7,981,767 B2 | | 7/2011 | Guenard et al. |
| 8,169,025 B2 | | 5/2012 | Bedell et al. |
| 8,962,447 B2 | * | 2/2015 | Forbes ............... 438/455 |
| 2004/0195656 A1 | | 10/2004 | Ghyselen et al. |
| 2007/0281435 A1 | * | 12/2007 | Thean et al. .......... 438/400 |

OTHER PUBLICATIONS

Castro et al, Selective and Anisotropic Dry Etching of Ge over Si, Journal of Integrated Circuits and Systems 2013, vol. 8, No. 2, pp. 104-109.

Kuhn et al., Past, Present and Future: SiGe and CMOS Transistor Sealing, ECS Trans., Bol. 33, No. 6, (2010), pp. 3-17.

Thean et al., Performance of Super-Critical Strained-Si Directly on Insulator (SC-SSOI) CMOS Based on High-Performance PD-SOI Technology, 2005 Symp-0osium on VLSI Technology Digest of Technical Papers, Jun. 14-16, 2005, pp. 134-135.

Thean et al., Uniaxial-Biaxial Stress Hybridization for Super-Critical Strained-Si Directly on Insulator (SC-SSOI) PMOS with Different Channel Orientations, Electron Devices Meeting, 2005. IEDM Technical Digest. IEEE International, Dec. 5, 2005, pp. 509-512.

Uchida et al., Experimental Study of Biaxial and Uniaxial Strain Effects on Carrier Mobility in Bulk and Ultrathin-Body SOI MOSFETs, Electron Devices Meeting, 2004. IEDM Technical Digest. IEEE International, Dec. 13-15, 2004, pp. 229-232.

* cited by examiner

METHOD FOR FABRICATING SEMICONDUCTOR STRUCTURES INCLUDING TRANSISTOR CHANNELS HAVING DIFFERENT STRAIN STATES, AND RELATED SEMICONDUCTOR STRUCTURES

TECHNICAL FIELD

Embodiments of the present disclosure relate to methods that may be used to fabricate n-type metal-oxide-semiconductor (NMOS) field effect transistors and p-type metal-oxide-semiconductor (PMOS) field effect transistors having different stress states in a common layer on a semiconductor substrate, and to semiconductor structures and devices fabricated using such methods.

BACKGROUND

Semiconductor devices such as microprocessors and memory devices employ solid state transistors as a basic, primary operational structure of the integrated circuits thereof. One type of transistor commonly employed in semiconductor structures and devices is the field effect transistor (FET), generally includes a source contact, a drain contact, and one or more gate contacts. A semiconductive channel region extends between the source contact and the drain contact. One or more pn junctions are defined between the source contact and the gate contact. The gate contact is located adjacent at least a portion of the channel region, and the conductivity of the channel region is altered by the presence of an electrical field. Thus, an electrical field is provided within the channel region by applying a voltage to the gate contact. Thus, for example, electrical current may flow through the transistor from the source contact to the drain contact through the channel region when a voltage is applied to the gate contact, but may not flow through the transistor from the source contact to the drain contact in the absence of an applied voltage to the gate contact.

Recently, field-effect transistors (FETs) have been developed that employ discrete, elongated channel structures referred to as "fins." Such a transistor is often referred to in the art as a "finFET." Many different configurations of finFETs have been proposed in the art.

The elongated channel structures or fins of a finFET comprise a semiconductor material that may be doped either n-type or p-type. It has also been demonstrated that the conductivity of n-type doped semiconductor materials may be improved when the n-type semiconductor material is in a state of tensile stress, and the conductivity of p-type semiconductor materials may be improved when the p-type semiconductor material is in a state of compressive stress.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of fabricating a semiconductor structure. A multi-layer substrate is provided that includes a base substrate, a buried oxide layer over a surface of the base substrate, and a strained semiconductor layer over the buried oxide layer on a side thereof opposite the base substrate. The strained semiconductor layer comprises crystalline semiconductor material. The method further includes implanting ions into a second region of the strained semiconductor layer without implanting ions into a first region of the strained semiconductor layer and converting a portion of the crystalline semiconductor material in the second region of the strained semiconductor layer to amorphous material such that the second region of the strained semiconductor layer has an amorphous region and an underlying crystalline region. The amorphous region is recrystallized, and elements are diffused from one portion of the second region of the strained semiconductor layer into another portion of the strained semiconductor layer so as to enrich a concentration of the diffused elements in the another portion of the second region of the strained semiconductor layer and alter a strain state of the second region of the strained semiconductor layer such that the second region of the strained semiconductor layer is in a strain state differing from a strain state of the first region of the strained semiconductor layer. A first plurality of transistor channel structures are formed that each comprise a portion of the first region of the semiconductor layer, and a second plurality of transistor channel structures are formed that each comprise a portion of the second region of the semiconductor layer.

In additional embodiments, the present disclosure includes semiconductor structures that may be fabricated by methods as disclosed herein. For example, in some embodiments, the present disclosure includes a semiconductor structure comprising a base substrate, a buried oxide layer over a surface of the base substrate, and a first plurality of transistor channel structures and a second plurality of transistor channel structures disposed over the buried oxide layer in a common plane on a side thereof opposite the base substrate. Each transistor channel structure of the second plurality of transistor channel structures comprises a condensed strained semiconductor layer including two or more elements. Each transistor channel structure of the first plurality of transistor channel structures comprises a non-condensed strained semiconductor layer. The transistor channel structures of the second plurality of transistor channel structures have a crystallographic strain differing from a crystallographic strain of the transistor channel structures of the first plurality of transistor channel structures.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

The illustrations presented herein are not meant to be actual views of any particular semiconductor structure, device, system, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

The terms first and second in the description and the claims are used for distinguishing between similar elements.

As used herein, the terms "fin" and "fin structure" mean an elongated, three-dimensional finite and bounded volume of semiconductor material having a length, a width, and a height, wherein the length is greater than the width. The width and height of the fin may vary along the length of the fin in some embodiments.

Described below with reference to the figures are methods that may be used to fabricate semiconductor structures, and semiconductor structures that may be fabricated using such methods.

Figure 1:
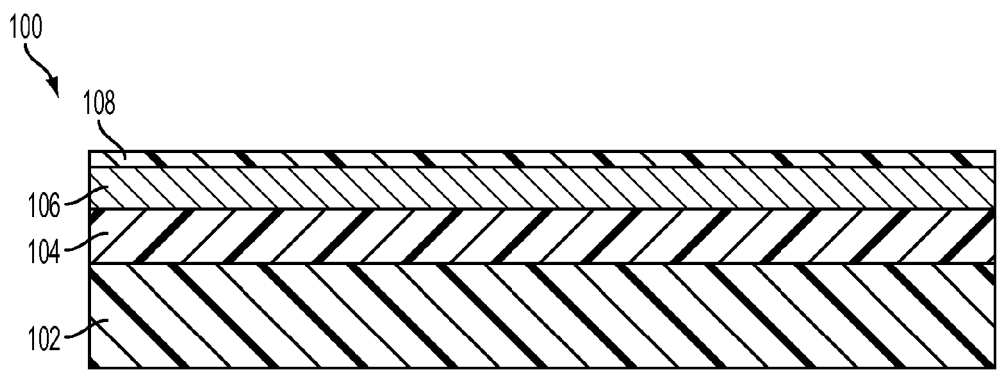
FIG. 1 is a simplified, schematically illustrated cross-sectional view illustrating a multi-layer substrate including a strained semiconductor layer that may be employed in accordance with embodiments of the present disclosure.

Referring to FIG. 1, a multi-layer substrate 100 may be provided that includes a base substrate 102, a buried oxide (BOX) layer 104 over a surface of the base substrate 102, and a strained semiconductor layer 106 over the BOX layer 104 on a side thereof opposite the base substrate 102. The strained semiconductor layer 106 may comprise a strained silicon layer, and the multi-layer substrate 100 may comprise a strained silicon-on-insulator (SSOI) substrate.

The base substrate 102 may comprise a die or wafer of, for example, semiconductor material (e.g., silicon, silicon carbide, germanium, a III-V semiconductor material, etc.), a ceramic material (e.g., silicon oxide, aluminum oxide, silicon carbide, etc.), or a metal material (e.g., molybdenum, etc.). The base substrate 102 may have a monocrystalline or polycrystalline microstructure in some embodiments. In other embodiments, the base substrate 102 may be amorphous. The base substrate 102 may have a thickness ranging from, for example, about 400 μm to about 900 μm (e.g., about 750 μm), although thicker or thinner base substrates 102 may also be employed.

The layers overlying the base substrate 102, such as the BOX layer 104, may be deposited, "grown," or otherwise formed over the substrate epitaxially using any of a number of different processes such as, for example, chemical vapor deposition (CVD), atomic layer deposition (ALD), physical vapor deposition (PLD), vapor phase epitaxy (VPE), molecular beam epitaxy (MBE) and thermal oxidation. In additional embodiments, they may be transferred to the base substrate 102 from another donor substrate using known processes.

By way of example and not limitation, the multi-layer substrate 100 may be formed using the process known in the art as the SMART-CUT® process, in which a layer of semiconductor material is transferred from a donor structure to receiving substrate (i.e., the base substrate) such that an oxide layer (i.e., the BOX layer 104) is disposed between the receiving substrate and the transferred layer semiconductor layer. The SMART-CUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

The BOX layer 104 may comprise, for example, an oxide (e.g., silicon dioxide, aluminum oxide, hafnium oxide, etc.), a nitride (e.g., silicon nitride), an oxynitride (e.g., silicon oxynitride), or a combination of such dielectric materials. The BOX layer 104 may be crystalline or amorphous. The BOX layer 104 may have an average layer thickness of, for example, between about 10 nm and about 200 nm, although thicker or thinner BOX layers 104 may also be employed in embodiments of the present disclosure.

The strained semiconductor layer 106 may comprise a strained (compressive or tensile) crystalline semiconductor material, such as a layer of tensile strained silicon (Si). In other embodiments, the strained semiconductor layer 106 may comprise strained germanium (Ge), strained silicon germanium (SiGe), or a strained III-V semiconductor material. Thus, the strained semiconductor material 106 may have a crystal structure exhibiting lattice parameters that are either above (tensile strained) or below (compressively strained) the relaxed lattice parameters that would normally be exhibited by the crystal structure of the respective semiconductor material in free-standing, bulk form at equilibrium state. The strained semiconductor layer 106 may have an average layer thickness of about 50 nm or less, or even about 10 nm or less. The strained semiconductor layer 106 may have an average layer thickness below a critical thickness of the strained semiconductor layer 106. In embodiments in which the strained semiconductor layer 106 comprises a strained silicon layer that is transferred to the base substrate 102 from a donor substrate, and wherein the strained semiconductor layer 106 is epitaxially grown on a SiGe buffer layer on the donor substrate prior to the layer transfer process, the critical thickness of the strained silicon layer may be a function of the germanium concentration in the SiGe buffer layer, with the critical thickness decreasing with increasing germanium concentration. Thicker layers of strained semiconductor material 106 may also be employed in embodiments of the present disclosure. The strained semiconductor layer 106 may be thickened to a thickness greater than its critical thickness, after transfer thereof to the base substrate 102, without degrading strain relaxation using epitaxy deposition techniques as disclosed in, for example, Thean et al., Uniaxial-Biaxial Stress Hybridization for Super-Critical Strained-Si Directly On Insulator (SC-SSOI) PMOS With Different Channel Orientations, IEEE International (Electron Devices Meeting, Washington, D.C. 2005), pages 509-512, which is incorporated herein in its entirety by this reference.

As a non-limiting specific example, the base substrate 102 of the donor substrate 100 may comprise a monocrystalline silicon substrate, the BOX layer 104 may comprise silicon dioxide ($SiO_2$), and the strained semiconductor layer 106 may comprise tensile strained monocrystalline silicon (sSi) having a thicknesses below its respective critical thickness so as to avoid the onset of relaxation and formation of localized defects in the crystal structure thereof.

In some embodiments, an oxide layer 108, which may be a native oxide layer or deposited oxide, may be present over the major surface of the strained semiconductor layer 106 on the side thereof opposite the BOX layer 104. In other embodiments, the oxide layer 108 may not be present.

Figure 2:
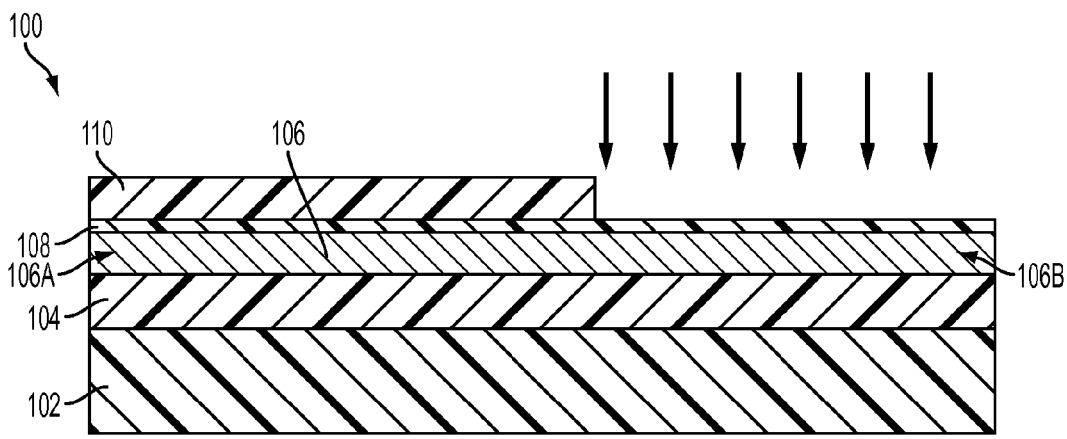
FIG. 2 illustrates the substrate of FIG. 1 after applying a mask layer over a portion of the multi-layer substrate, and illustrates implantation of ions into the strained semiconductor layer in an un-masked portion of the multi-layer substrate.

Referring to FIG. 2, a patterned mask layer 110 may be provided over the strained semiconductor layer 106. The patterned mask layer 110 may cover one or more regions of the strained semiconductor layer 106, while other regions of the strained semiconductor layer 106 may be uncovered by the patterned mask layer 110. As a non-limiting example, FIG. 2 illustrates a first region of the strained semiconductor layer 106A that is covered by the patterned mask layer 110, and a second region of the strained semiconductor layer 106B that is uncovered by the patterned mask layer 110.

The patterned mask layer 110 may comprise a hard mask layer material, such as one or more of an oxide layer, a nitride layer, or an oxynitride layer. The patterned mask layer 110 may be formed by depositing or otherwise providing a continuous layer of hard mask material over the multi-layer substrate 100, and subsequently patterning the hard mask material using a photolithographic masking and etching process to form apertures through the hard mask material at the locations at which it is desired to remove portions of the hard mask material to uncover regions of the strained semiconductor layer 106. In other embodiments, the patterned mask layer 110 may comprise a photoresist masking material.

With continued reference to FIG. 2, after forming the patterned mask layer 110, ions may be implanted into the region or regions of the strained semiconductor layer 106 that are uncovered by the patterned mask layer 110 (as indicated by the directional arrows), such as the second region of the strained semiconductor layer 106B, without implanting ions into the region or regions of the strained semiconductor layer 106 that are covered by the patterned mask layer 110, such as the first region of the strained semiconductor layer 106A. The ions may pass through the apertures in the mask layer 110 and into the first region of the strained semiconductor layer 106A, while the mask layer 110 shields the second region of the strained semiconductor layer 106B and prevents the ions from being implanted therein.

In some embodiments, the oxide layer 108, if present, may be removed from over the strained semiconductor layer 106 such that a surface of the strained semiconductor layer 106 is exposed. In other embodiments, however, the ions may be implanted into the strained semiconductor layer 106 through the oxide layer 108.

The implantation of the ions may convert a portion of the crystalline semiconductor material of the strained semiconductor layer 106 to amorphous material. Thus, the region or regions of the semiconductor layer 106 into which the ions are implanted may have an amorphous region 112 and an underlying crystalline region 114, as illustrated in the enlarged view of FIG. 3.

The implanted ions may be ions of elements different from at least one element present in the crystal structure of the semiconductor layer 106. For example, in embodiments in which the strained semiconductor layer comprises strained silicon (sSi), the implanted ions may comprise, for example, germanium ions, which are different from silicon. The reason for this, is that the implanted ions, having a different atomic radii relative to other elements in the semiconductor layer 106, may be used to subsequently alter a strain state of the semiconductor layer 106 in subsequent processing as described in further detail below.

Table 1 below provides examples of germanium concentration and germanium content in a tensile strained silicon semiconductor layer 106 at layer thicknesses of the semiconductor layer 106, for each of five (5) different dosages of a germanium ion implantation process performed with ion implant energies of 40-50 KeV.

TABLE 1

| Dose No. | Ge Implant Dose (at.cm−2) | Ge Conc. (at.cm−3) | Ge Content | Si Layer Thickness |
|---|---|---|---|---|
| (1) | 1.00E+15 | 1.00E+19 | 0.02% | 100 nm |
| (2) | 5.00E+15 | 5.00E+19 | 0.10% | |
| (3) | 1.00E+16 | 1.00E+20 | 0.20% | |
| (4) | 5.00E+16 | 5.00E+20 | 1.00% | |
| (5) | 1.00E+17 | 1.00E+21 | 2.00% | |
| (1) | 1.00E+15 | 2.00E+19 | 0.04% | 50 nm |
| (2) | 5.00E+15 | 1.00E+20 | 0.20% | |
| (3) | 1.00E+16 | 2.00E+20 | 0.40% | |
| (4) | 5.00E+16 | 1.00E+21 | 2.00% | |
| (5) | 1.00E+17 | 2.00E+21 | 4.00% | |
| (1) | 1.00E+15 | 3.33E+19 | 0.07% | 30 nm |
| (2) | 5.00E+15 | 1.67E+20 | 0.33% | |
| (3) | 1.00E+16 | 3.33E+20 | 0.67% | |

TABLE 1-continued

| Dose No. | Ge Implant Dose (at.cm−2) | Ge Conc. (at.cm−3) | Ge Content | Si Layer Thickness |
|---|---|---|---|---|
| (4) | 5.00E+16 | 1.67E+21 | 3.33% | |
| (5) | 1.00E+17 | 3.33E+21 | 6.67% | |
| (1) | 1.00E+15 | 5.00E+19 | 0.10% | 20 nm |
| (2) | 5.00E+15 | 2.50E+20 | 0.50% | |
| (3) | 1.00E+16 | 5.00E+20 | 1.00% | |
| (4) | 5.00E+16 | 2.50E+21 | 5.00% | |
| (5) | 1.00E+17 | 5.00E+21 | 10.00% | |
| (1) | 1.00E+15 | 1.00E+20 | 0.20% | 10 nm |
| (2) | 5.00E+15 | 5.00E+20 | 1.00% | |
| (3) | 1.00E+16 | 1.00E+21 | 2.00% | |
| (4) | 5.00E+16 | 5.00E+21 | 10.00% | |
| (5) | 1.00E+17 | 1.00E+22 | 20.00% | |

Figure 3:
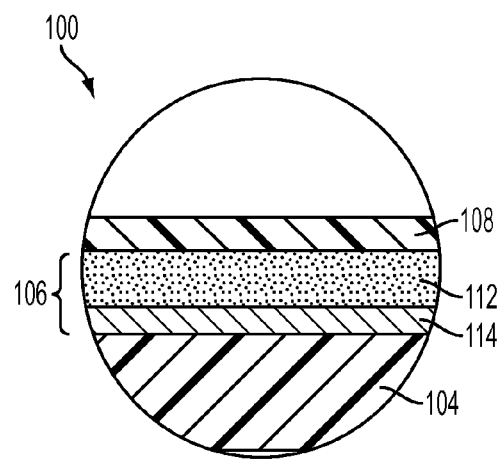
FIG. 3 is an enlarged view of a portion of the substrate of FIGS. 1 and 2 showing a portion of the semiconductor layer after implanting ions therein, such that an amorphous region is formed within the semiconductor layer.
Figure 4:
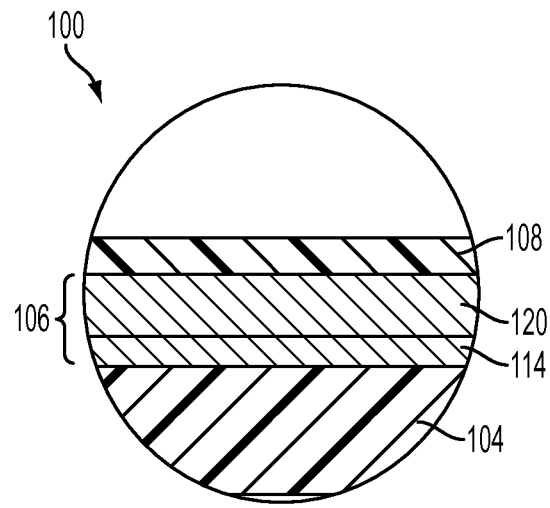
FIG. 4 is similar to FIG. 3 and illustrates the portion of the semiconductor layer after recrystallizing the amorphous region therein.

Referring to FIG. 4, after implanting the ions into the region or regions of the strained semiconductor layer 106 such that the region or regions include an amorphous region 112 and an underlying crystalline region 114 (as shown in FIG. 3), the amorphous regions 112 of the semiconductor layer 106 may be recrystallized. For example, an annealing process carried out in a furnace at elevated temperatures may be used to recrystallize the amorphous regions 112 and form recrystallized regions 120, as shown in FIG. 4. Upon recrystallization, the recrystallized regions 120 may be in a strain state that is different from a strain state of the first region of the strained semiconductor layer 106A (FIG. 2), due to the presence of the implanted ions (e.g., germanium ions) having a different atomic radii relative to at least one element (e.g., silicon) present in semiconductor layer 106 as initially formed.

Thus, in embodiments in which the strained semiconductor layer 106 as initially formed comprises tensile strained silicon, and the implanted ions comprise germanium ions, the recrystallized regions 120 may comprise $Si_yGe_{1-y}$, wherein y is from about 0.01 to about 0.50, or from about 0.10 to about 0.20 in some embodiments.

During the recrystallization process, the recrystallization of the amorphous regions 112 of the semiconductor layer 106 may be seeded by the underlying crystalline regions 114 of the semiconductor layer 106. Since the underlying crystalline region 114 of the semiconductor layer 106 may comprise silicon and the recrystallized regions 120 may comprise $Si_yGe_{1-y}$, the recrystallized regions 114 of $Si_yGe_{1-y}$ form upon the underlying Si, and the crystal lattice of the $Si_yGe_{1-y}$ may be constrained by the underlying Si, such that the recrystallized regions of $Si_yGe_{1-y}$ are in a state of compressive strain (the lattice parameters of $Si_yGe_{1-y}$ being greater than the lattice parameters of Si, since the atomic radius of Ge is larger than that of Si).

Figure 5:
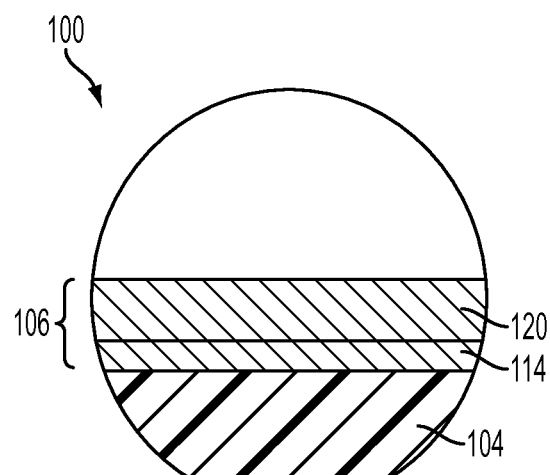
FIG. 5 is similar to FIGS. 3 and 4, and illustrates the portion of the semiconductor layer after removing an oxide layer from the surface of the semiconductor layer.

Referring to FIG. 5, after recrystallizing the amorphous regions 112 of the semiconductor layer 106 to form the recrystallized regions 120, the optional oxide layer 108, if present, may be removed using one or more of a chemical etching process, a mechanical polishing process, or a chemical-mechanical polishing (CMP) process.

Figure 6:
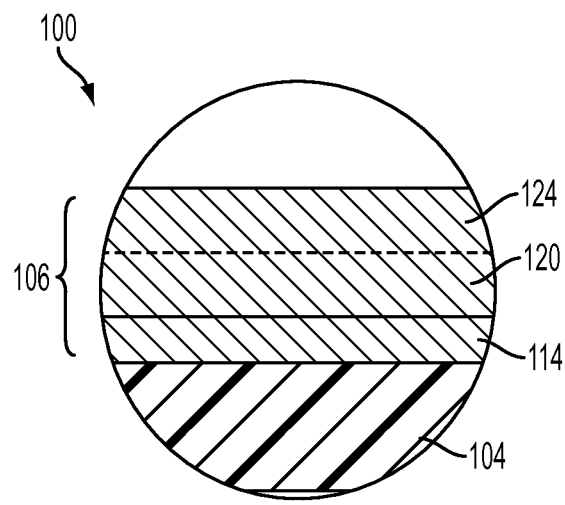
FIG. 6 is similar to FIGS. 3 through 5, and illustrates the portion of the semiconductor layer after epitaxially depositing additional semiconductor material on the semiconductor layer so as to thicken the semiconductor layer.

As shown in FIG. 6, in some embodiments, additional semiconductor material 124 may be selectively epitaxially grown on the second region of the semiconductor layer 106B without epitaxially growing additional semiconductor material on the first region of the semiconductor layer 106A. The additional semiconductor material 124 may comprise silicon or $Si_{1-y}Ge_y$, for example.

In some embodiments, the growth of the additional semiconductor material 124 may be carried out after recrystallizing the amorphous regions 112 to form the recrystallized regions 120, as illustrated in the sequence of the figures. In other embodiments, however, the growth of the additional semiconductor material 124 may be carried out prior to implanting ions into the second region of the semiconductor layer 106B and forming the amorphous regions 112 (FIG. 3). The selective epitaxial growth of additional semiconductor material 124 as discussed in relation to FIG. 6, when performed prior to the ion implantation process described with reference to FIG. 2, may also enable the implantation of a higher quantity of ions, which may allow for attaining higher concentrations of the implanted ions in the second region of the semiconductor layer 106B, as well as performance of a longer thermal diffusion process as described below with reference to FIG. 7, and, hence, a larger degree of alteration of a strain state of the second region of the semiconductor layer 106B.

The thickness of the additional semiconductor material 124 selectively epitaxially grown over the second region of the semiconductor layer 106B may be selected such that, subsequent to a diffusion and enrichment process described below with reference to FIG. 7, a thickness of the second region of the semiconductor layer 106B may be at least substantially equal to a thickness of the first region of the semiconductor layer 106A, which is not subjected to the diffusion and enrichment process described with reference to FIG. 7.

Figure 7:
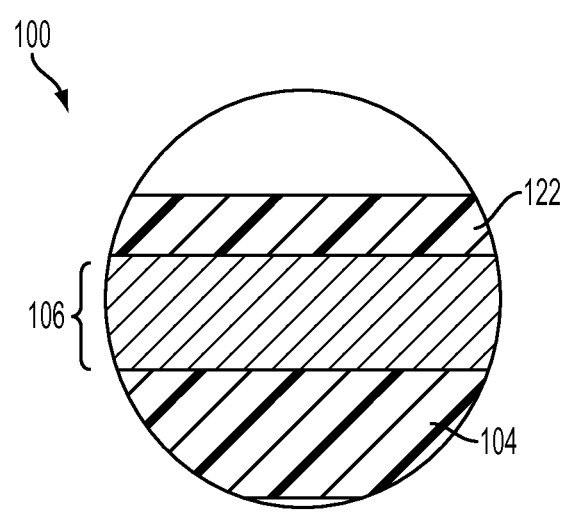
FIG. 7 is similar to FIGS. 3 through 6 and illustrates the portion of the semiconductor layer after diffusing elements from one region thereof into another region thereof so as to enrich a region of the semiconductor layer with one or more elements and alter a strain state of the region of the semiconductor layer.

Referring to FIG. 7, after recrystallizing the amorphous regions 112 of the second region of the semiconductor layer 106B to form the recrystallized regions 120, elements may be diffused from one portion of the recrystallized regions 120 of the second region of the semiconductor layer 106B into another portion of the second region of the semiconductor layer 106B so as to enrich a concentration of the diffused elements in the another portion of the second region of the semiconductor layer 106B and alter a strain state of the second region of the semiconductor layer 106B.

For example, a condensation process (often referred to as a "thermal mixing" process) or another type of process may be used to diffuse elements within the second region of the semiconductor layer 106B such that they are concentrated and enriched within a portion of the second region of the semiconductor layer 106B so as to selectively reduce tensile strain, increase compressive strain, and/or relax the strain in the second region of the semiconductor layer 106B relative to the level of strain in the first region of the semiconductor layer 106A. In such embodiments, the elements may not be diffused in any substantial manner within the first region of the semiconductor layer 106A. In other words, the condensation process may be carried out only on the second region of the semiconductor layer 106B, but not the first region of the semiconductor layer 106A. Such a condensation process is described below.

FIG. 7 is similar to FIGS. 3 through 6 and illustrates the multi-layer substrate 100 after carrying out a condensation process on the second region of the semiconductor layer 106B. The condensation process may involve subjecting the second region of the semiconductor layer 106B to an oxidation process in a furnace at elevated temperatures (e.g., about between about 900° C. and about 1150° C.) in an oxidizing atmosphere (e.g., dry $O_2$ with or without HCL). The oxidation process may result in the formation of an oxide layer 122 at the surface of the second region of the semiconductor layer 106B, and may cause diffusion of elements from within an upper region of the second region of the semiconductor layer 106B into a lower region of the second region of the semiconductor layer 106B.

In embodiments in which the strained semiconductor layer 106 comprises strained silicon (sSi), the ions implanted into the second region of the semiconductor layer 106B as described with reference to FIG. 2 may comprise germanium ions, and the germanium atoms may diffuse further into the second region of the semiconductor layer 106B during the condensation process. An oxide layer 122 may form at the surface of the second region of the semiconductor layer 106B and grow in thickness into the second region of the semiconductor layer 106B. As the thickness of the oxide layer 122 grows during the germanium condensation process, the thickness of the $Si_yGe_{1-y}$ semiconductor layer 106 decreases, and the concentration of germanium in the semiconductor layer 106 increases until the $Si_yGe_{1-y}$ semiconductor layer 106 has a desired concentration of germanium therein. The diffusion and concentration of germanium within the second region of the semiconductor layer 106B may result in a decrease in any tensile strain within the strained semiconductor layer 106, and may lead to relaxation of the strain and/or generation of compressive strain within the strained semiconductor layer 106.

As a result, the first region of the semiconductor layer 106A may be in a first strain state and the second region of the semiconductor layer 106B may be in a second strain state differing from the first strain state.

The oxide layer 122 formed in the diffusion and enrichment process (e.g., condensation process) may be removed form over the second region of the semiconductor layer 106B prior to subsequent processing.

As previously mentioned, the first region of the semiconductor layer 106A may comprise a tensile strained silicon layer. The tensile strain in the first region of the semiconductor layer 106A may provide improved electron mobility within the first region of the semiconductor layer 106A, which may be desirable for forming n-type FET transistors having channel regions comprising portions of the first region of the semiconductor layer 106A. The ion-implantation and recrystallization process, as well as the condensation process, performed in the second region of the semiconductor layer 106B may result in improved hole mobility within the second region of the semiconductor layer 106B, which may be desirable for forming p-type FET transistors having channel regions comprising portions of the second region of the semiconductor layer 106B.

Figure 8:
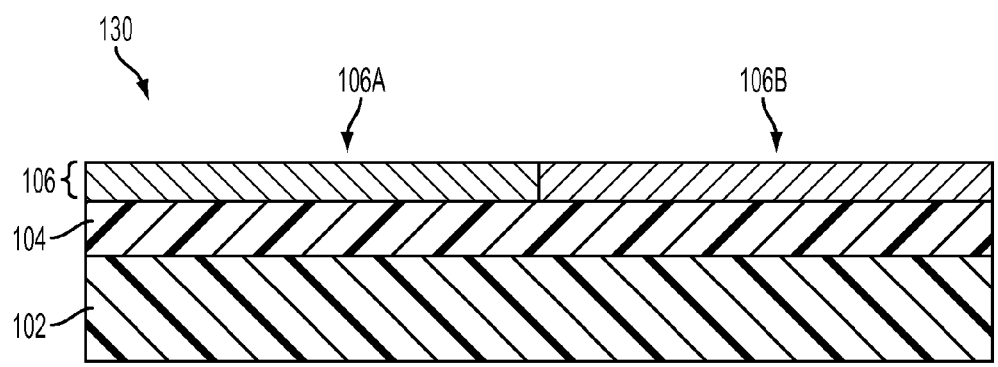
FIG. 8 is a simplified, schematically illustrated cross-sectional view illustrating a semiconductor structure fabricated using the methods described with reference to FIGS. 1-7, which comprises a semiconductor-on-insulator (SeOI) substrate including a semiconductor layer having regions of different strain states over a buried oxide layer on a base substrate.

As shown in FIG. 8, the oxide layer 108 and the mask layer 110 overlying the semiconductor layer 106 may be removed to form a semiconductor structure 130. The semiconductor structure 130 shown in FIG. 8, which is formed by the methods as described with reference to FIGS. 1-7, includes a base substrate 102, a BOX layer 108 over a surface of the base substrate 102, and a first region of a semiconductor layer 106A and a second region of a semiconductor layer 106B disposed over the BOX layer 104 in a common plane on a side of the BOX layer 104 opposite the base substrate 102. The semiconductor structure 130 may be subsequently processed to complete fabrication of a semiconductor device including both n-type and p-type transistors. The n-type transistors may be formed on and/or in the first region of the semiconductor layer 106, and the p-type transistors may be formed on and/or in the second region of the semiconductor layer 106.

Figure 9:
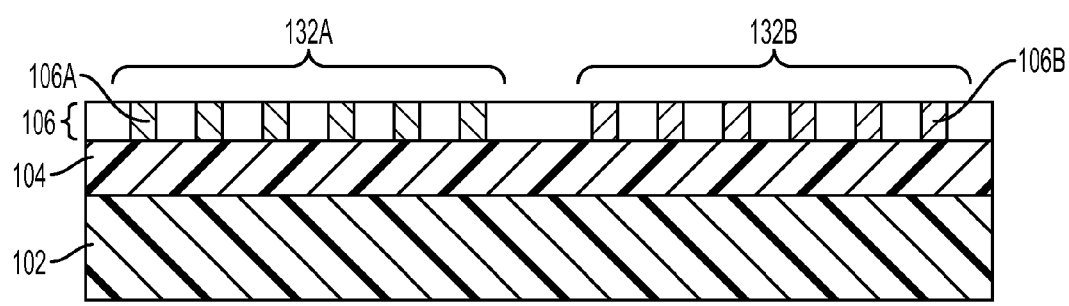
FIG. 9 is a simplified, schematically illustrated cross-sectional view illustrating a semiconductor structure that may be fabricated from the SeOI substrate of FIG. 8, and includes a first plurality of fin structures formed in a region of the semiconductor layer having a first strain state, and a second plurality of fin structures formed in a region of the semiconductor layer having a different second strain state.

FIG. 9, for example, illustrates for formation of a first plurality of fin structures 132A each comprising a portion of the first region of the semiconductor layer 106A, and a second plurality of fin structures 132B each comprising a portion of the second region of the semiconductor layer 106B. Each of the fin structures 132A, 132B is sized and configured for use as a transistor channel structure in finFET type transistors. As a non-limiting example, each of the fin structures 132A, 132B may be formed to have an average width of about 15 nm or less.

The fin structures 132B of the second plurality of fin structures 132B have a crystallographic strain differing from a crystallographic strain of the fin structures 132A of the first plurality of fin structures 132A. Each fin structure 132A of the first plurality of fin structures 132A includes a non-condensed strained semiconductor material. Each fin structure 132B of the second plurality of fin structures 132B includes a condensed strained semiconductor material including two or more elements (e.g., silicon and germanium).

After forming the first and second pluralities of fin structures 132A, 132B, a first plurality of n-type finFET transistors may be formed comprising the first plurality of fin structures 132A, and a second plurality of p-type finFET transistors may be formed comprising the second plurality of fin structures 132B.

Figure 10:
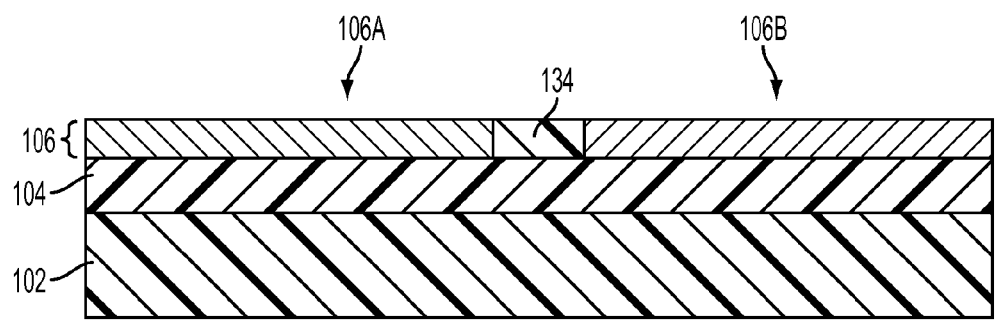
FIG. 10 is a simplified, schematically illustrated cross-sectional view illustrating another semiconductor structure that may be fabricated from the SeOI substrate of FIG. 8, and includes a shallow trench isolation structure formed between the regions of different strain states.

In additional embodiments, the semiconductor structure 130 of FIG. 8 may be subsequently processed to form a plurality of conventional planar n-type metal-oxide semiconductor field effect transistors (NMOS FETs) on and/or in the first region of the semiconductor layer 106A, and a plurality of conventional planar p-type metal-oxide semiconductor field effect transistors (PMOS FETs) on and/or in the second region of the semiconductor layer 106B, as illustrated in FIG. 10. For example, one or more shallow trench isolation (STI) structures 134 may be formed partially or entirely through the semiconductor layer 106 so as to electrically isolate transistor channel regions to be formed in the semiconductor layer 106. Conventional STI processing may be used to define transistor channel structures in the semiconductor layer 106. In such processing, a masking and etching process may be used to form trenches between the adjacent transistor channel structures, and dielectric material may be provided within the trenches to form STI structures 134 between the transistor channel structures. Thus, the STI structures 134 in the semiconductor layer 106 may be used to electrically isolate the transistor channel structures to be defined in the semiconductor layer 106. Although only one STI structure 134 is illustrated in FIG. 10, a plurality of such STI structures 134 may be used to define the transistor channel structures in the semiconductor layer 106.

After forming the STI structures 134 in the semiconductor layer 106, a first plurality of transistor channel structures may be formed that each comprise a portion of the first region of the semiconductor layer 106A, and a second plurality of transistor channel structures may be formed that each comprise a portion of the second region of the semiconductor layer 106B. The transistor channel structures may be sized and configured for use as transistor channel structures in MOS FET type transistors.

The NMOS FET transistor channel structures formed in the first region of the semiconductor layer 106A have a crystallographic strain differing from a crystallographic strain of the PMOS FET transistor channel structures formed in the second region of the semiconductor layer 106B. After forming the first and second pluralities of transistor channel structures, a first plurality of NMOS FET transistors may be formed comprising the first plurality of transistor channel structures, and a second plurality of PMOS FET transistors may be formed comprising the second plurality of transistor channel structures.

In additional embodiments, a first plurality of NMOS FET transistors may be formed comprising the first plurality of transistor channel structures, and a second plurality of PMOS FET transistors may be formed comprising the second plurality of transistor channel structures, prior to forming the STI structures 134. FIGS. 11 through 16 illustrate an additional embodiment of a method that may be used to fabricate coplanar n-type and p-type finFET transistors similar to that described above with reference to FIGS. 1 through 9.

Figure 11:
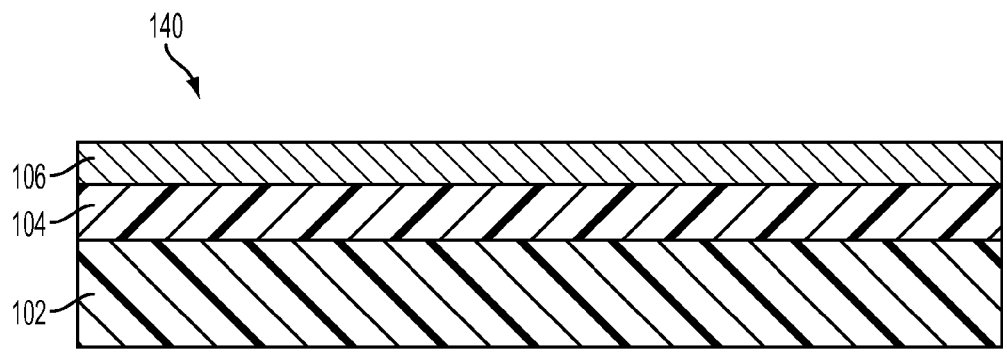
FIG. 11 is a simplified, schematically illustrated cross-sectional view illustrating another multi-layer substrate like that of FIG. 1 including a strained semiconductor layer that may be employed in accordance with embodiments of the present disclosure.

FIG. 11 illustrates a multi-layer substrate 140 that includes a base substrate 102, a buried oxide layer 104, and a strained semiconductor layer 106 as previously described herein with reference to FIG. 1.

Figure 12:
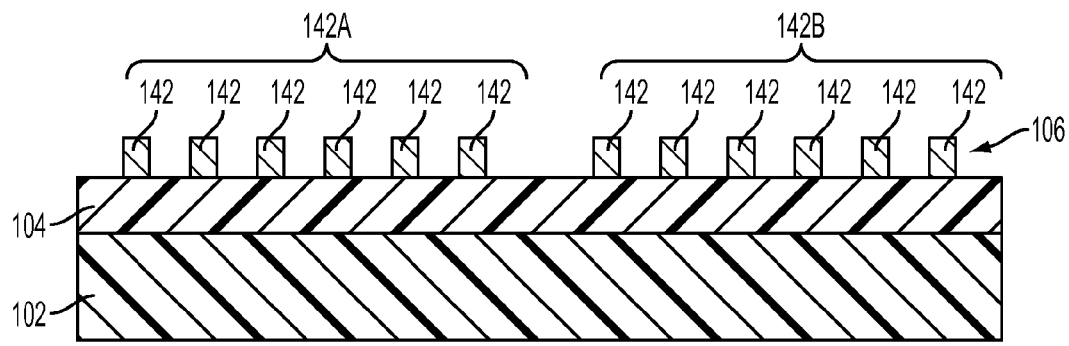
FIG. 12 illustrates a plurality of fin structures formed from the strained semiconductor layer of the substrate of FIG. 11.

As shown in FIG. 12, the strained semiconductor layer 106 may be patterned using, for example, a masking and etching process to form fin structures 142 each comprising a region of the strained semiconductor layer 106. The fin structures 142 may be formed using finFET fabrication processes known in the art, and may include Spacer-Defined Double Patterning (SDDP) processes (also known in the art as "Side-wall Image Transfer" processes). The fin structures 142 may include a second plurality of fin structures 142B and a first plurality of fin structures 142A.

Figure 13:
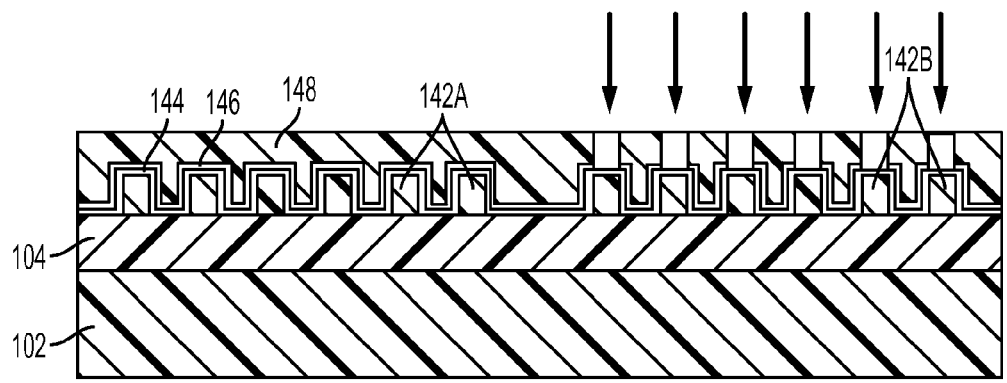
FIG. 13 illustrates implantation of ions into some, but not all of the fin structures.

Referring to FIG. 13, one or more masking layers may be deposited over the fin structures 142. The masking layers may include, for example, a passivating oxide layer 144, a nitride layer 146, and a mask layer 148. The mask layer 148 may comprise, for example, a photoresist masking material, which may be patterned to form apertures therethrough over the second plurality of fin structures 142B. One or both of the oxide layer 144 and the nitride layer 146 may be removed using one or more etching processes, in which they are exposed to an etchant through the apertures in the mask layer 148 while the mask layer 148 shields the remainder of the structure from the etchant. As shown in FIG. 13, in some embodiments, regions of the nitride layer 146 overlying the second plurality of fin structures 142B may be removed using an etching process, while at least a portion of the oxide layer 144 may be left in place over the second plurality of fin structures 142B. In other embodiments, however, the portions of the oxide layer 144 overlying the second plurality of fin structures 142B may be at least substantially completely removed. The mask layer 148 optionally may be removed prior to subsequent processing, or the mask layer 148 may be left in place as shown in FIG. 13.

Figure 14:
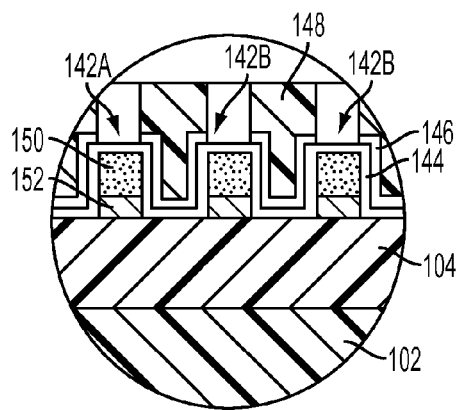
FIG. 14 is an enlarged view of a portion of the substrate of FIG. 13 showing some of the fin structures after implanting ions into the fin structures and forming an amorphous region within the fin structures.

As shown in FIG. 13, ions may be implanted into the second plurality of fin structures 142B through the apertures in one or both of the mask layer 148 and the nitride layer 146 in a process as previously described with reference to FIG. 2 so as to form amorphous regions 150 in portions of the second plurality of fin structures 142B, as shown in FIG. 14. The second plurality of fin structures 142B may include crystalline regions 114 of the strained semiconductor layer 106 remaining under the amorphous regions 150, substantially as previously described with reference to FIG. 3.

Figure 15:
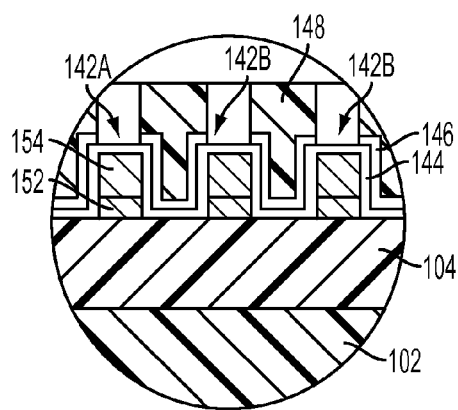
FIG. 15 is similar to FIG. 14 and illustrates the fin structures after recrystallizing the amorphous regions therein.

Referring to FIG. 15, after forming the amorphous regions 150, the amorphous regions 150 may be recrystallized to form recrystallized regions 154. The recrystallization process may be carried out as previously described with reference to FIG. 4.

Figure 16:
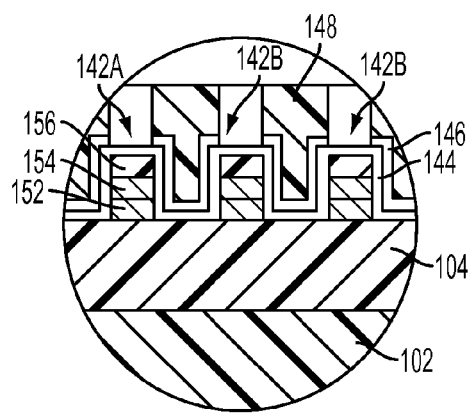
FIG. 16 is similar to FIGS. 14 and 15, and illustrates the fin structures after diffusing elements from one region thereof into another region thereof so as to enrich a region of the fin structures with one or more elements and alter a strain state of the fin structures.

Referring to FIG. 16, a diffusion and enrichment process (e.g., a condensation process) may be carried out on the second plurality of fin structures 142B in a manner as previously described with reference to FIG. 7 after forming the recrystallized regions 154 (FIG. 15). The diffusion and enrichment process may result in the formation of an oxide layer 156 over each of the fin structures 142B of the second plurality.

Optionally, epitaxial growth of additional semiconductor material also may be carried out on the second plurality of fin structures 142B prior to performing the diffusion and enrichment process, as previously described with reference to FIGS. 5 and 6.

Thus, the second plurality of fin structures 142B may comprise transistor channel structures sized and configured for forming p-type finFET transistors, and the first plurality of fin structures 142A may comprise transistor channel structures sized and configured for forming n-type finFET transistors.

After forming the first and second pluralities of fin structures 142A, 142B as previously described with reference to FIGS. 11-16, a first plurality of NMOS finFET transistors may be formed comprising the first plurality of fin structures 142A, and a second plurality of PMOS finFET transistors may be formed comprising the second plurality of fin structures 142B.

Figure 17:
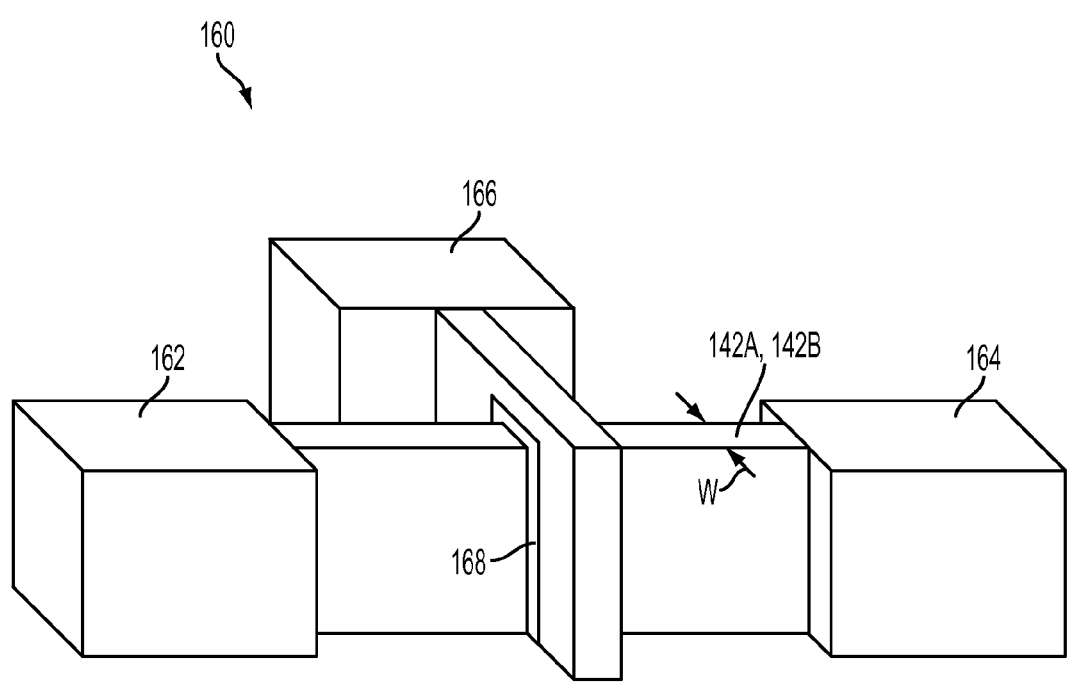
FIG. 17 illustrates an example structure of a finFET transistor.

FIG. 17 illustrates a non-limiting simplified example embodiment of a finFET transistor configuration that may be fabricated using the second plurality of fin structures 142B and/or the first plurality of fin structures 142A in accordance with embodiments of the present disclosure (of the fin structures of FIG. 9). It should be noted that many different configurations of finFETs are known in the art and may be employed in accordance with embodiments of the disclosure, and the finFET structure shown in FIG. 17 is set forth merely as an example of such finFET structures.

As shown in FIG. 17, a finFET transistor 160 comprises a source region 162, a drain region 164, and a channel extending between the source region 162 and the drain region 164. The channel is defined by and comprises a fin, such as either a first fin structure 142A or a second fin structure 142B. In some embodiments, the source region 162 and the drain region 164 may include, or be defined by, longitudinal end portions of a fin structure 142. A conductive gate 166 extends over and adjacent at least a portion of the fin structure 142 between the source region 162 and the drain region 164. The gate 166 may be separated from the fin structure 142 by a dielectric material 168. The gate 166 may include a multi-layer structure, and may include semiconductive and/or conductive layers. A low-resistance layer including a metal, a metal compound or both, such as a conductive silicide, may be deposited over the source region 162 and/or the drain region 164 to form electrical contacts therewith.

Advantageously, tensile stress/strain in the channel can increase the performance of NMOS finFET transistors and reduce the threshold voltage, while reduced tensile stress/strain (e.g., less tensile stress, no tensile or compressive stress, or compressive stress) in the channel can increase the performance of PMOS finFET transistors and reduce the threshold voltage. For some functions, strained devices are beneficial because high performance is needed, and for some other functions, performance is not as important, but a high threshold voltage is beneficial. With embodiments of the present disclosure, the manufacturer can selectively incorporate differing levels of stress and strain into the crystal lattices of different finFET or MOSFET transistors in the same device in a common FET transistor plane.

Additional, non-limiting example embodiments of the disclosure are set forth below.

Embodiment 1

A method of fabricating a semiconductor structure, comprising: providing a multi-layer substrate, including: a base substrate, a buried oxide layer over a surface of the base substrate, and a strained semiconductor layer over the buried oxide layer on a side thereof opposite the base substrate, the strained semiconductor layer comprising crystalline semiconductor material; implanting ions into a second region of the strained semiconductor layer without implanting ions into a first region of the strained semiconductor layer and converting a portion of the crystalline semiconductor material in the second region of the strained semiconductor layer to amorphous material such that the second region of the strained semiconductor layer has an amorphous region and an underlying crystalline region; recrystallizing the amorphous region; diffusing elements from one portion of the second region of the strained semiconductor layer into another portion of the strained semiconductor layer so as to enrich a concentration of the diffused elements in the another portion of the second region of the strained semiconductor layer and alter a strain state of the second region of the strained semiconductor layer such that the second region of the strained semiconductor layer is in a strain state differing from a strain state of the first region of the strained semiconductor layer; and forming a first plurality of transistor channel structures each comprising a portion of the first region of the semiconductor layer and a second plurality of transistor channel structures each comprising a portion of the second region of the semiconductor layer.

Embodiment 2

The method of Embodiment 1, further comprising selecting the strained semiconductor layer to comprise strained silicon.

Embodiment 3

The method of Embodiment 2, further comprising selecting the strained semiconductor layer to comprise tensile strained silicon.

Embodiment 4

The method of Embodiment 2 or Embodiment 3, wherein implanting ions into the second region of the strained semiconductor layer comprises implanting germanium ions into the second region of the strained semiconductor layer to form $Si_yGe_{1-y}$, wherein y is from about 0.10 to about 0.50, and wherein diffusing elements from one portion of the second region of the strained semiconductor layer into another portion of the strained semiconductor layer comprises diffusing germanium into the another portion of the second region of the strained semiconductor layer.

Embodiment 5

The method of any one of Embodiments 1 through 4, wherein forming the first plurality of transistor channel structures and the second plurality of transistor channel structures comprises forming a first plurality of fin structures each comprising a portion of the first region of the semiconductor layer and a second plurality of fin structures each comprising a portion of the second region of the semiconductor layer.

Embodiment 6

The method of Embodiment 5, further comprising forming a plurality of n-type FinFET transistors comprising the first plurality of fin structures and forming a plurality of p-type FinFET transistors comprising the second plurality of fin structures.

Embodiment 7

The method of any one of Embodiments 1 through 6, further comprising forming the transistor channel structures of the first and second pluralities of transistor channel structures to have an average width of about 15 nm or less.

Embodiment 8

The method of any one of Embodiments 1 through 7, wherein diffusing elements from one portion of the second region of the strained semiconductor layer into another portion of the strained semiconductor layer comprises relaxing strain in the second region of the strained semiconductor layer.

Embodiment 9

The method of Embodiment 8, wherein relaxing strain in the second region of the strained semiconductor layer comprises increasing a hole mobility within the second region of the strained semiconductor layer.

Embodiment 10

The method of any one of Embodiments 1 through 9, wherein diffusing elements from one portion of the second region of the strained semiconductor layer into another portion of the strained semiconductor layer comprises carrying out a condensation process on the second region of the strained semiconductor layer.

Embodiment 11

The method of Embodiment 10, wherein carrying out a condensation process on the second region of the strained semiconductor layer comprises oxidizing a portion of the second region of the strained semiconductor layer.

Embodiment 12

The method of any one of Embodiments 1 through 11, wherein recrystallizing the amorphous region comprises seeding recrystallization of the amorphous region with the underlying crystalline region.

Embodiment 13

The method of any one of Embodiments 1 through 12, further comprising epitaxially growing additional semiconductor material on the second region of the semiconductor layer without growing additional semiconductor material on the first region of the semiconductor layer prior to diffusing elements from one portion of the second region of the strained semiconductor layer into the another portion of the strained semiconductor layer.

Embodiment 14

A semiconductor structure, comprising: a base substrate, a buried oxide layer over a surface of the base substrate, a first plurality of transistor channel structures and a second plurality of transistor channel structures disposed over the buried oxide layer in a common plane on a side thereof opposite the base substrate, each transistor channel structure of the second plurality of transistor channel structures comprising a condensed strained semiconductor layer including two or more elements, each transistor channel structure of the first plurality of transistor channel structures comprising a non-condensed strained semiconductor layer; wherein the transistor channel structures of the second plurality of transistor channel structures have a crystallographic strain differing from a crystallographic strain of the transistor channel structures of the first plurality of transistor channel structures.

Embodiment 15

The semiconductor structure of Embodiment 14, wherein the non-condensed strained semiconductor layer of each transistor channel structure of the first plurality of transistor channel structures comprises strained silicon.

Embodiment 16

The semiconductor structure of Embodiment 14 or Embodiment 15, wherein the condensed strained semiconductor layer of each transistor channel structure of the second plurality of transistor channel structures comprises $Si_xGe_{1-x}$, wherein x is from about 0.01 to about 0.50.

Embodiment 17

The semiconductor structure of any one of Embodiments 14 through 16, wherein the transistor channel structures of the first plurality of transistor channel structures are in a state of tensile strain and the transistor channel structures of the first plurality of transistor channel structures are relaxed or in a state of compressive strain.

Embodiment 18

The semiconductor structure of any one of Embodiments 14 through 17, wherein the transistor channel structures of the first plurality of transistor channel structures and the second plurality of transistor channel structures have an average width of about 15 nm or less.

Embodiment 19

The semiconductor structure of any one of Embodiments 14 through 18, wherein the transistor channel structures of each of the first plurality of transistor channel structures and the second plurality of transistor channel structures comprise fin structures.

Embodiment 20

The semiconductor structure of Embodiment 19, further comprising a first plurality of n-type FinFET transistors comprising the first plurality of transistor channel structures, and a second plurality of p-type FinFET transistors comprising the second plurality of transistor channel structures.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of fabricating a semiconductor structure, comprising:
   providing a multi-layer substrate, including:
      a base substrate,
      a buried oxide layer over a surface of the base substrate, and
      a strained semiconductor layer over the buried oxide layer on a side thereof opposite the base substrate, the strained semiconductor layer comprising crystalline semiconductor material;
   implanting ions into a second region of the strained semiconductor layer without implanting ions into a first region of the strained semiconductor layer and converting a portion of the crystalline semiconductor material in the second region of the strained semiconductor layer to amorphous material such that the second region of the strained semiconductor layer has an amorphous region and an underlying crystalline region;
   recrystallizing the amorphous region;
   diffusing elements from one portion of the second region of the strained semiconductor layer into another portion of the strained semiconductor layer so as to enrich a concentration of the diffused elements in the another portion of the second region of the strained semiconductor layer and alter a strain state of the second region of the strained semiconductor layer such that the second region of the strained semiconductor layer is in a strain state differing from a strain state of the first region of the strained semiconductor layer; and
   forming a first plurality of transistor channel structures each comprising a portion of the first region of the semiconductor layer and a second plurality of transistor channel structures each comprising a portion of the second region of the semiconductor layer.

2. The method of claim 1, further comprising selecting the strained semiconductor layer to comprise strained silicon.

3. The method of claim 2, further comprising selecting the strained semiconductor layer to comprise tensile strained silicon.

4. The method of claim 2, wherein implanting ions into the second region of the strained semiconductor layer comprises implanting germanium ions into the second region of the strained semiconductor layer to form $Si_yGe_{1-y}$, wherein y is from about 0.10 to about 0.50, and wherein diffusing elements from one portion of the second region of the strained semiconductor layer into another portion of the strained semiconductor layer comprises diffusing germanium into the another portion of the second region of the strained semiconductor layer.

5. The method of claim 1, wherein forming the first plurality of transistor channel structures and the second plurality of transistor channel structures comprises forming a first plurality of fin structures each comprising a portion of the first region of the semiconductor layer and a second plurality of fin structures each comprising a portion of the second region of the semiconductor layer.

6. The method of claim 5, further comprising forming a plurality of n-type FinFET transistors comprising the first plurality of fin structures and forming a plurality of p-type FinFET transistors comprising the second plurality of fin structures.

7. The method of claim 1, further comprising forming the transistor channel structures of the first and second pluralities of transistor channel structures to have an average width of about 15 nm or less.

8. The method of claim 1, wherein diffusing elements from one portion of the second region of the strained semiconductor layer into another portion of the strained semiconductor layer comprises relaxing strain in the second region of the strained semiconductor layer.

9. The method of claim 8, wherein relaxing strain in the second region of the strained semiconductor layer comprises increasing a hole mobility within the second region of the strained semiconductor layer.

10. The method of claim 1, wherein diffusing elements from one portion of the second region of the strained semiconductor layer into another portion of the strained semiconductor layer comprises carrying out a condensation process on the second region of the strained semiconductor layer.

11. The method of claim 10, wherein carrying out a condensation process on the second region of the strained semiconductor layer comprises oxidizing a portion of the second region of the strained semiconductor layer.

12. The method of claim 1, wherein recrystallizing the amorphous region comprises seeding recrystallization of the amorphous region with the underlying crystalline region.

13. The method of claim 1, further comprising epitaxially growing additional semiconductor material on the second region of the semiconductor layer without growing additional semiconductor material on the first region of the semiconductor layer prior to diffusing elements from one portion of the second region of the strained semiconductor layer into the another portion of the strained semiconductor layer.

\* \* \* \* \*